(12) United States Patent
Okazaki et al.

(10) Patent No.: US 11,946,010 B2
(45) Date of Patent: Apr. 2, 2024

(54) SLIDING MEMBER, MANUFACTURING METHOD THEREOF, AND COATING FILM

(71) Applicant: NIPPON PISTON RING CO., LTD., Saitama (JP)

(72) Inventors: Takahiro Okazaki, Saitama (JP); Hiroyuki Sugiura, Saitama (JP)

(73) Assignee: NIPPON PISTON RING CO., LTD., Saitama (JP)

( * ) Notice: Subject to any disclaimer, the term of this patent is extended or adjusted under 35 U.S.C. 154(b) by 41 days.

(21) Appl. No.: 17/764,768

(22) PCT Filed: Sep. 30, 2020

(86) PCT No.: PCT/JP2020/037281
§ 371 (c)(1),
(2) Date: Mar. 29, 2022

(87) PCT Pub. No.: WO2021/066058
PCT Pub. Date: Apr. 8, 2021

(65) Prior Publication Data
US 2022/0396746 A1 Dec. 15, 2022

(30) Foreign Application Priority Data
Sep. 30, 2019 (JP) .................................. 2019-178891

(51) Int. Cl.
*C10M 103/02* (2006.01)
*C23C 14/02* (2006.01)
(Continued)

(52) U.S. Cl.
CPC .......... *C10M 103/02* (2013.01); *C23C 14/024* (2013.01); *C23C 14/0605* (2013.01);
(Continued)

(58) Field of Classification Search
CPC .......... C10M 103/02; C10M 2201/0413; C23C 14/024; C23C 14/0605; C23C 14/325;
(Continued)

(56) References Cited

U.S. PATENT DOCUMENTS 11,247,903 B2* 2/2022 Moriguchi .......... C23C 14/0605
11,293,548 B2* 4/2022 Okazaki ................. C23C 14/541
(Continued)

FOREIGN PATENT DOCUMENTS

WO 2017/104822 A1 6/2017
WO 2018/235750 A1 12/2018

OTHER PUBLICATIONS

Written Opinion of the International Searching Authority dated Dec. 1, 2020 in International Application No. PCT/JP2020/037281.
(Continued)

*Primary Examiner* — Ellen M McAvoy
(74) *Attorney, Agent, or Firm* — Sughrue Mion, PLLC

(57) ABSTRACT

To provide a sliding member comprising a coating film exhibiting constant and stable chipping resistance and wear resistance and excellent in peeling resistance (adhesion), and the coating film thereof. The above-described problem is solved by a sliding member (10) comprising a coating film (1) on a sliding surface (16) on a base material (11). The coating film (1) has, when a cross section thereof is observed by a bright-field TEM image, a total thickness within a range of 1 μm to 50 μm, in repeating units including black hard carbon layers (B), relatively shown in black, and white hard carbon layers (W), relatively shown in white, and laminated in a thickness direction (Y). In the black hard carbon layer (B) and the white hard carbon layer (W) adjacent to each other, the white hard carbon layer (W) has higher hardness and a larger $[sp^2/(sp^2+sp^3)]$ ratio than the black hard carbon layer (B).

14 Claims, 5 Drawing Sheets

(51) Int. Cl.
  *C23C 14/06* (2006.01)
  *C23C 14/32* (2006.01)
  *F16J 9/26* (2006.01)
  *C10N 50/00* (2006.01)

(52) U.S. Cl.
  CPC ............... *C23C 14/325* (2013.01); *F16J 9/26* (2013.01); *C10M 2201/0413* (2013.01); *C10N 2050/023* (2020.05)

(58) Field of Classification Search
  CPC ....... C23C 28/044; C23C 28/42; C23C 28/44; F16J 9/26; C10N 2050/023; C01B 32/05
  See application file for complete search history.

(56) References Cited

U.S. PATENT DOCUMENTS

| | | | |
|---|---|---|---|
| 2015/0292622 A1* | 10/2015 | Kennedy | C23C 14/0605 277/442 |
| 2015/0330507 A1* | 11/2015 | Kamura | C22C 30/00 427/451 |
| 2017/0306257 A1* | 10/2017 | Moriguchi | C23C 14/325 |
| 2018/0231125 A1* | 8/2018 | Ooshiro | C23C 16/0281 |
| 2018/0245200 A1* | 8/2018 | Shinohara | F16J 9/26 |
| 2018/0371608 A1* | 12/2018 | Moriguchi | C23C 28/044 |
| 2019/0100434 A1* | 4/2019 | Moriguchi | C01B 32/05 |
| 2020/0056700 A1* | 2/2020 | Kameda | C23C 14/025 |
| 2020/0217416 A1* | 7/2020 | Okazaki | C23C 14/16 |
| 2021/0156021 A1* | 5/2021 | Ooshiro | C23C 16/26 |
| 2021/0270370 A1* | 9/2021 | Sato | C23C 30/005 |

OTHER PUBLICATIONS

Chinese Office Action dated Sep. 23, 2023 in Chinese Application No. 202080068880.X.
Haiyang, "Diamond-like thin films of Preparation, structure and property studies", China Atomic Energy Press, 2020, No. 137861 (33 pages total).
Qunfeng, "Ultra-low tribological behavior of diamond-like films", Harbin Institute of Technology Press, 2021, No. 034889 (15 pages total).
Yonghong, "Modern Thin Film Materials and Technology", Northwestern Polytechnic University Press, 2016, No. 199040, (15 pages total).
Extended European Search Report dated Sep. 21, 2023 in Application No. 20871967.4.

* cited by examiner

SLIDING MEMBER, MANUFACTURING METHOD THEREOF, AND COATING FILM

FIELD OF THE INVENTION

The present invention relates to a sliding member, a manufacturing method thereof, and a coating film. More specifically, the present invention relates to a sliding member exhibiting constant and stable chipping resistance and wear resistance and excellent in peeling resistance (adhesion), a manufacturing method thereof, and a coating film.

BACKGROUND ART

In recent years, in various industrial fields, particularly in the automobile field, the study of hard carbon layers as coating films on surfaces of sliding members that require slidability, such as an engine base material or other machine base materials, is prevalent. The hard carbon layer is generally called by various names such as a diamond-like carbon (DLC) layer, amorphous carbon layer, i-carbon layer, and diamond-like carbon layer. Such hard carbon layers are structurally classified as amorphous.

In the hard carbon layer, single bonds such as seen in diamond crystals, and double bonds such as seen in graphite crystals, are considered to co-exist. The hard carbon layer has properties such as high hardness, high wear resistance, and excellent chemical stability similar to those of the diamond crystals as well as properties such as low hardness, high lubricity, and excellent running-in property mated similar to those of the graphite crystals. Further, the hard carbon layer, being amorphous, has excellent flatness, low frictionality (that is, a small friction coefficient) in direct contact with a mated material, and excellent running-in property mated as well.

On a sliding surface of the sliding member, chipping resistance (defect resistance) and wear resistance are important properties. However, the chipping resistance (defect resistance) and wear resistance are in a trade-off relationship, making it difficult to provide a coating film that satisfies these. As means therefor, it has been studied that, a hard carbon layer having low hardness is provided, or a mixed layer of a hard carbon having low hardness and a hard carbon having high hardness is provided, achieving both chipping resistance and wear resistance.

Nevertheless, the present situation is that both chipping resistance and wear resistance are still not sufficiently achieved. In particular, even though a coating film provided to a sliding member such as a piston ring to which a high load is applied is required to have chipping resistance and wear resistance as well as low frictionality and peeling resistance, improvement of these properties is still insufficient. In recent years, various techniques have been proposed to address these issues.

For example, in Patent Document 1, there is proposed a technique that, even though a physical vapor deposition (PVD) method, makes it possible to form a thick hard carbon layer having excellent durability, and thus achieve both chipping resistance and wear resistance of the formed hard carbon layer and improve low frictionality and peeling resistance. This technique is one in which a coating film covers a surface of a base material and includes, when a cross section thereof is observed by a bright-field transmission electron microscope (TEM) image, a white hard carbon layer, relatively shown in white, and a black hard carbon layer, relatively shown in black, alternately laminated in a thickness direction and having a total film thickness greater than 1 μm and less than or equal to 50 μm, the white hard carbon layer including a region grown in a fan shape in the thickness direction.

Further, in Patent Document 2, there are proposed a sliding member including a coating film exhibiting constant and stable chipping resistance and wear resistance and excellent in peeling resistance (adhesion), and the coating film thereof. This technique is one in which a sliding member includes a coating film composed of a hard carbon layer on a sliding surface, and the coating film has, when a cross section thereof is observed by a bright-field TEM image, a thickness within a range of 1 μm to 50 μm, in repeating units including black hard carbon layers, relatively shown in black, and white hard carbon layers, relatively shown in white, and laminated in a thickness direction, the coating film including an inclined region, provided on a base material side, where thicknesses of the white hard carbon layers of the repeating units gradually increase in a thickness direction, and a homogeneous region, provided on a surface side, where thicknesses of the white hard carbon layers of the repeating units are the same or substantially the same in the thickness direction, the inclined region having a V-shaped or radially grown form in the thickness direction, and the homogeneous region not having a V-shaped or radially grown form in the thickness direction.

PRIOR ART DOCUMENTS

Patent Documents

Patent Document 1: International Publication WO2017/104822A1

Patent Document 2: International Publication WO2018/235750A1

SUMMARY OF THE INVENTION

Problems to be Solved by the Invention

An object of the present invention is to provide a new sliding member exhibiting constant and stable chipping resistance and wear resistance and excellent in peeling resistance (adhesion), a manufacturing method thereof, and a coating film.

Means for Solving the Problems (1) A sliding member according to the present invention comprises a coating film on a sliding surface on a base material. The coating film has, when a cross section thereof is observed by a bright-field TEM image, a total thickness within a range of 1 μm to 50 μm, in repeating units including black hard carbon layers, relatively shown in black, and white hard carbon layers, relatively shown in white, and laminated in a thickness direction. In the black hard carbon layer and the white hard carbon layer adjacent to each other, the white hard carbon layer has higher hardness and a larger $[sp^2/(sp^2+sp^3)]$ ratio than the black hard carbon layer.

Similar to the prior art, the black hard carbon layers relatively have high density and a small $[sp^2/(sp^2+sp^3)]$ ratio, and are excellent in strength. The white hard carbon layers relatively have low density and a large $[sp^2/(sp^2+sp^3)]$ ratio, and are excellent in low frictionality and chipping resistance. However, unlike the prior art, in the present invention, in the black hard carbon layer and the white hard carbon layer adjacent to each other, the white hard carbon layer has higher hardness and a larger $[sp^2/(sp^2+sp^3)]$ ratio than the black hard carbon layer. By providing a coating film that is a laminate of these hard carbon layers on the sliding surface, it is possible to obtain a sliding member excellent in chipping resistance, wear resistance, and peeling resistance (adhesion) on the basis of a laminating effect of the hard carbon layers having different properties.

In the sliding member according to the present invention, a ratio (T1/T2) of a thickness T1 of the black hard carbon layer to a thickness T2 of the white hard carbon layer is within a range of 1/10 to 1.5/1. According to this invention, the thickness ratio (T1/T2) of the repeating unit can be controlled as desired and be constant or varied in the thickness direction of the coating film.

In the sliding member according to the present invention, a thickness of the repeating unit is within a range of 0.2 to 2 μm. According to this invention, the thickness of each repeating unit can be controlled as desired and be set within the above-described range.

In the sliding member according to the present invention, a Vickers hardness of the black hard carbon layer is within a range of 700 to 1600 HV, and a Vickers hardness of the white hard carbon layer is higher than a Vickers hardness of the adjacent black hard carbon layer and within a range of 1200 to 2200 HV.

In the sliding member according to the present invention, the $[sp^2/(sp^2+sp^3)]$ ratio of the black hard carbon layer is within a range of 0.05 to 0.75, and the $[sp^2/(sp^2+sp^3)]$ ratio of the white hard carbon layer is larger than the $[sp^2/(sp^2+sp^3)]$ ratio of the black hard carbon layer and within a range of 0.20 to 0.80.

In the sliding member according to the present invention, when a cross section thereof is observed by a bright-field TEM image, a hard carbon base film may be provided between the base material or a base film provided on the base material, and the coating film.

In the sliding member according to the present invention, when a cross section thereof is observed by a bright-field TEM image, a hard carbon surface film may be provided on the coating film.

In the sliding member according to the present invention, the $[sp^2/(sp^2+sp^3)]$ ratio of the black hard carbon layer increases from the base material side toward a surface position in a thickness direction of the coating film.

In the sliding member according to the present invention, the white hard carbon layer has a fine striped pattern.

In the sliding member according to the present invention, the black hard carbon layer has a fine striped pattern.

In the sliding member according to the present invention, the black hard carbon layer and the white hard carbon layer each include, directly below, a carbon layer formed by a bombarding treatment.

In the sliding member according to the present invention, the sliding member is a piston ring.

(2) A manufacturing method of a sliding member according to the present invention is a method for manufacturing a sliding member including a coating film on a sliding surface on a base material. The coating film has, when a cross section thereof is observed by a bright-field TEM image, a total thickness within a range of 1 μm to 50 μm, in repeating units including black hard carbon layers, relatively shown in black, and white hard carbon layers, relatively shown in white, and laminated in a thickness direction. The manufacturing method comprises forming the black hard carbon layer at a bias voltage that causes a temperature rise, and forming the white hard carbon layer at a bias voltage that does not cause a temperature rise.

(3) A coating film according to the present invention has, when a cross section thereof is observed by a bright-field TEM image, a total thickness within a range of 1 μm to 50 μm, in repeating units including black hard carbon layers, relatively shown in black, and white hard carbon layers, relatively shown in white, and laminated in a thickness direction. In the black hard carbon layer and the white hard carbon layer adjacent to each other, the white hard carbon layer has higher hardness and a larger $[sp^2/(sp^2+sp^3)]$ ratio than the black hard carbon layer.

Effect of the Invention

According to the present invention, it is possible to provide a new sliding member including a coating film exhibiting constant and stable chipping resistance and wear resistance and excellent in peeling resistance (adhesion), a manufacturing method thereof, and a coating film, particularly as a sliding member such as a piston ring to which a high load is applied, and a coating film.

EMBODIMENTS OF THE INVENTION

A sliding member, a manufacturing method thereof, and a coating film according to the present invention will now be described in detail with reference to the drawings. It should be noted that the present invention is not limited only to the following descriptions and drawings and modifications within the scope of the gist are also included.

[Sliding Member]

Figure 5:
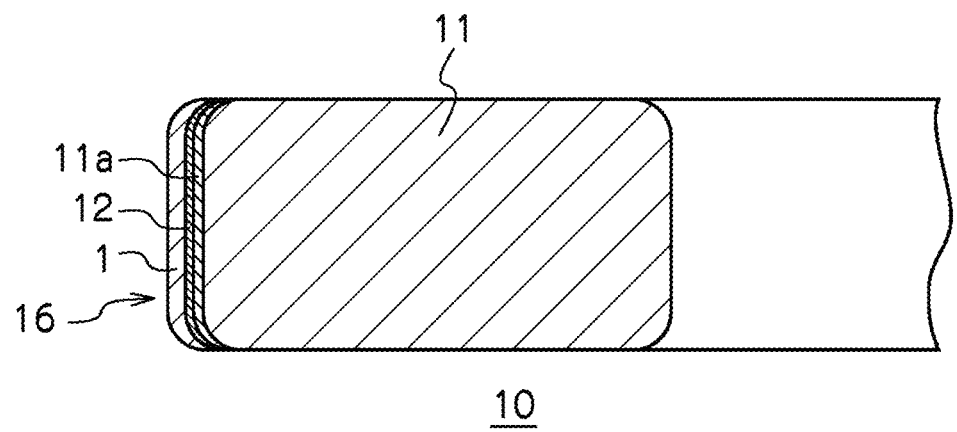
FIG. 5 is a schematic sectional view illustrating an example of a piston ring including the coating film.

A sliding member 10 according to the present invention is, for example, the sliding member 10 including a coating film 1 on a sliding surface 16, as illustrated in the example of a piston ring in FIG. 5. The coating film 1 has, when a cross section thereof is observed by a bright-field transmission electron microscope (TEM) image, a total thickness within a range of 1 μm to 50 μm, in repeating units (denoted by an asterisk (*) in FIGS. 2A and 2B) including black hard carbon layers B, relatively shown in black, and white hard carbon layers W, relatively shown in white, and laminated in a thickness direction Y. Then, in the black hard carbon layer B and the white hard carbon layer W adjacent to each other, the white hard carbon layer W has higher hardness and a larger $[sp^2/(sp^2+sp^3)]$ ratio than the black hard carbon layer B. It should be noted that, in the following, the $[sp^2/(sp^2+sp^3)]$ ratio may be abbreviated as "$sp^2/sp^3$ ratio."

In the coating film 1 constituting such a sliding member 10, similar to the prior art, the black hard carbon layers B relatively have high density and a small $sp^2/sp^3$ ratio, and are excellent in strength, and the white hard carbon layers relatively have low density and a large $sp^2/sp^3$ ratio, and are excellent in low frictionality and chipping resistance. However, in this coating film 1, unlike the prior art, in the black hard carbon layer B and the white hard carbon layer W adjacent to each other, the white hard carbon layer W has higher hardness and a larger $sp^2/sp^3$ ratio than the black hard carbon layer B. By providing the coating film 1 that is a laminate of these hard carbon layers B, W on the sliding surface 16, it is possible to obtain the sliding member 10 excellent in chipping resistance, wear resistance, and peeling resistance (adhesion) on the basis of a laminating effect of the hard carbon layers having different properties.

It should be noted that the bright-field TEM image can be obtained by observing the coating film 1 thinned by using a focused ion beam (FIB) through a TEM at an acceleration voltage of 300 kV, for example. The thickness direction Y refers to the direction in which the coating film 1 is sequentially laminated on a base material 11.

The following describes the components of the sliding member in detail. It should be noted that while, in the following, descriptions are often made with a piston ring used as an example of the sliding member, the sliding member according to the present invention is not limited to the piston ring.

(Base Material)

Figure 1:
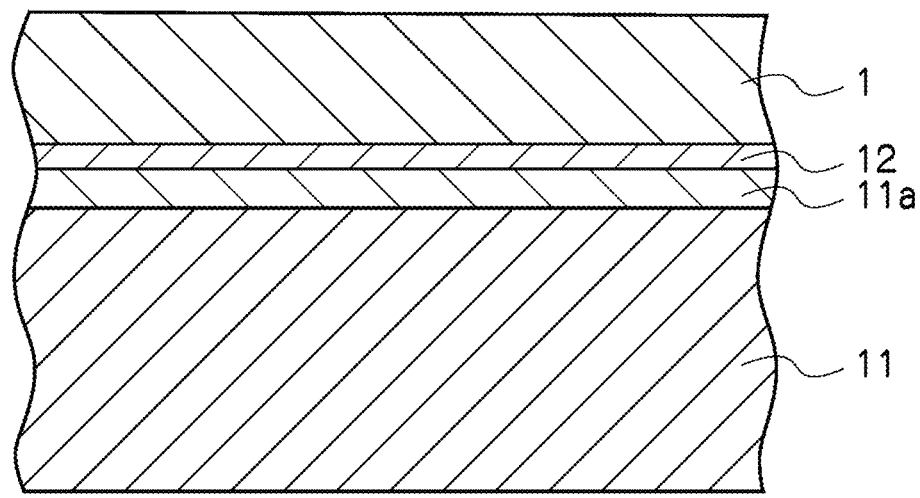
FIG. 1 is a schematic sectional view illustrating an example of a coating film provided to a sliding member according to the present invention.
Figure 2A:
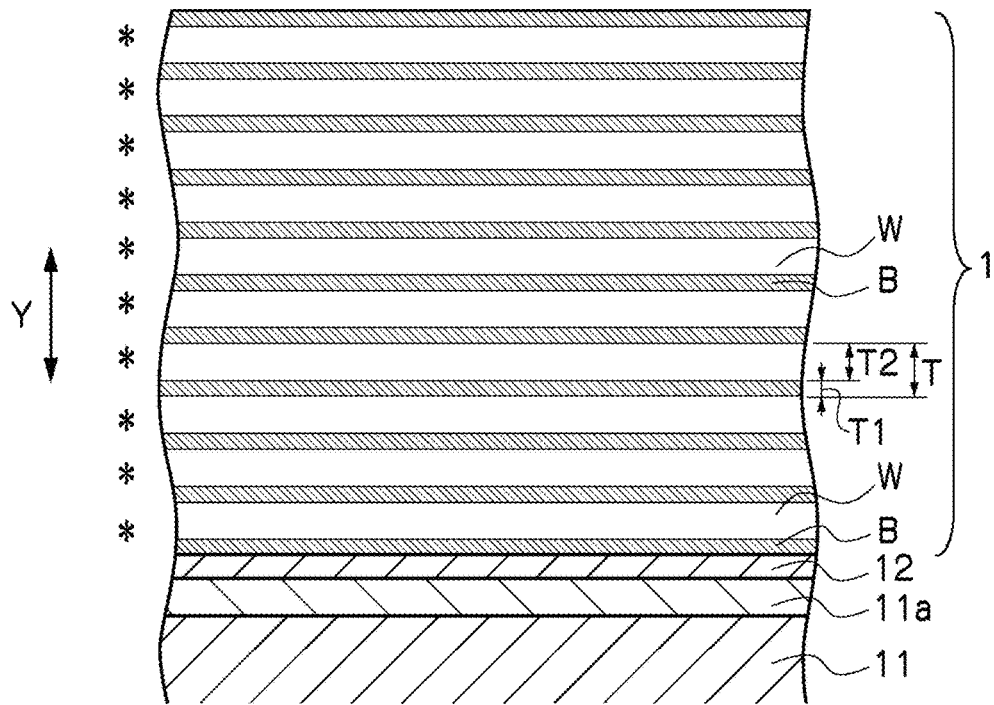
FIGS. 2A and 2B are explanatory views of the coating film, FIG. 2A being an example of laminating a repeating unit obtained by forming a black hard carbon layer B and then forming a white hard carbon layer W thereon, and FIG. 2B being an example of laminating a repeating unit obtained by forming the white hard carbon layer W and then forming the black hard carbon layer B thereon.
Figure 2B:
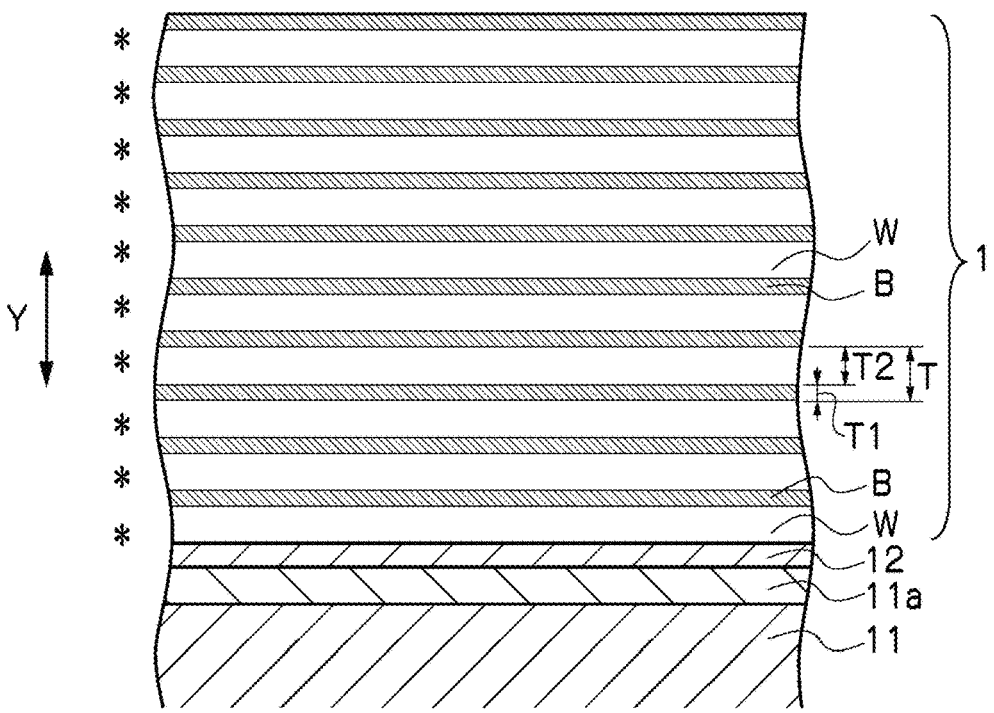

The base material 11 is a target member on which the coating film 1 is provided, as illustrated in FIG. 1 and FIGS. 2A and 2B. Examples of the base material 11, while not particularly limited, include a ferrous metal, a non-ferrous metal, ceramic, a hard composite material, and the like. For example, carbon steel, alloy steel, quenched steel, high-speed tool steel, cast iron, aluminum alloy, magnesium alloy, cemented carbide, and the like can be included. It should be noted that, in consideration of the film-forming temperature of the coating film 1, a base material having properties that do not significantly deteriorate at a temperature exceeding 200° C. is preferred.

Examples of the piston ring base material 11 in a case in which the coating film 1 is applied to the piston ring 10 include various materials used as the base material of the piston ring 10, and the material is not particularly limited. For example, various steel materials, stainless steel materials, casting materials, cast steel materials, and the like can be applied. Among these, a martensitic stainless steel, a chromium-manganese steel (SUP9 material), a chrome vanadium steel (SUP10 material), a silicon chromium steel (SWOSC-V material), and the like can be included. This base material 11 may include an underlayer 11a illustrated in FIG. 1 as necessary. Examples of such an underlayer 11a include an underlayer or the like that increases the adhesion with an intermediate layer 12 described later, and the underlayer is not particularly limited.

The piston ring base material 11 may be provided with a layer composed of nitride, carbonitride, carbide, or the like, containing at least one of Cr, Ti, Si, Al, and the like as the underlayer 11a in advance. Examples of such a compound layer include CrN, TiN, CrAlN, TiC, TiCN, TiAlSiN, and the like. Among these, preferably, a nitrided layer (not illustrated) formed by performing nitriding treatment, and a Cr—N based, a Cr—B—N based, a Ti—N based wear-resistant film, and the like (not illustrated) can be included.

Further, among these, a Cr—N based, a Cr—B—N based, a Ti—N based wear-resistant film, or the like is preferably formed. It should be noted that the piston ring 10 exhibits excellent wear resistance even without such a nitriding treatment or formation of a Cr or Ti based wear-resistant film, and thus the nitriding treatment and formation of the Cr or Ti based wear-resistant film are not necessarily required.

The piston ring base material 11 may be pretreated as necessary. Such a pretreatment is preferably performed by polishing the surface to adjust surface roughness. Adjustment of the surface roughness is preferably performed by, for example, methods such as lapping and polishing the surface of the piston ring base material 11 using diamond abrasive grains. Such a piston ring base material 11 can be preferably applied as a pretreatment before formation of the intermediate layer 12 and the like described later, or as a pretreatment for the underlayer 11a and the like provided in advance before formation of the intermediate layer 12 and the like.

(Intermediate Layer)

The intermediate layer 12 is preferably provided as necessary between the base material 11 and the coating film 1, as illustrated in FIG. 1 and FIGS. 2A and 2B. By this intermediate layer 12, the adhesion between the base material 11 and the coating film 1 can be improved.

Examples of the intermediate layer 12 include a layer containing at least one or two or more elements of Cr, Ti, Si, W, B, and the like. It should be noted that the underlayer 11a composed of a compound such as nitride, carbonitride, or carbide, and including at least one or two or more elements of Cr, Ti, Si, Al, and the like, may be provided below the intermediate layer 12 (between the base material 11 and the intermediate layer 12). Examples of such a compound include CrN, TiN, CrAlN, TiC, TiCN, TiAlSiN, and the like. It should be noted that the underlayer 11a provided with the intermediate layer 12 as necessary can be formed by means such as a vacuum depositing method or an ion plating method for setting the base material 11 into a chamber, creating a vacuum in the chamber, subsequently performing pre-heating, ion cleaning, and the like, and introducing an inert gas, nitrogen gas, or the like, for example.

Examples of the intermediate layer 12 in a case in which the coating film 1 is applied to the piston ring 10 include a titanium film, a chromium film, or the like. The intermediate layer 12 in this case need not necessarily be provided as well, and thus formation is optional. The intermediate layer 12 composed of a titanium film, a chromium film, or the like can be formed by various film-forming means such as a vacuum depositing method, a sputtering method, and an ion plating method. For example, the intermediate layer 12 can be formed by setting the piston ring base material 11 into a chamber, creating a vacuum in the chamber, subsequently performing pre-heating, ion cleaning, and the like, and introducing an inert gas. While a thickness of the intermediate layer 12 is not particularly limited, the thickness is preferably within a range of 0.05 μm to 2 μm, inclusive. It should be noted that, while the intermediate layer 12 is preferably formed on at least the outer peripheral sliding surface 16 on which sliding occurs upon contact by the piston ring 10 with a cylinder liner (not illustrated), the intermediate layer 12 may be formed on other surfaces, such as an upper surface, a lower surface, or an inner peripheral surface of the piston ring 10, for example.

This intermediate layer 12 may be directly formed on the piston ring base material 11, or may be formed on the above-mentioned surface after the nitriding treatment, or on the underlayer 11a composed of an wear-resistant film. The intermediate layer 12 can improve the adhesion between the piston ring base material 11 and the coating film 1. It should be noted that, in order to improve the adhesion and the like between the intermediate layer 12 and the coating film 1 as well, another layer may be provided as needed. For example, a film having the same or substantially the same components as the coating film 1 described later may be formed as a hard carbon base film.

(Coating Film)

As shown in FIGS. 2A and 2B and FIGS. 3 and 4, the coating film 1 includes two types of hard carbon layers (W, B) relatively shown in the two colors white and black when a bright-field TEM image of the cross section is observed. The black hard carbon layer B and the white hard carbon layer W are laminated to constitute a repeating unit (denoted by an asterisk (*) in FIGS. 2A and 2B), and the repeating unit is laminated in the thickness direction Y to obtain the coating film 1 having a total thickness within the range of 1 μm to 50 μm. It should be noted that "relatively" means the relative relationship of the hues when the cross section is observed by the bright-field TEM image, and the layer that looks black is the "black hard carbon layer B" and the layer that looks white is the "white hard carbon layer W."

In a case in which the coating film 1 is applied to the piston ring 10, the coating film 1 is formed on at least the outer peripheral sliding surface 16 on which the piston ring 10 slides upon contact with a cylinder liner (not illustrated), as illustrated in FIG. 5. It should be noted that the coating film 1 may be optionally formed on other surfaces, such as the upper surface, the lower surface, and the inner peripheral surface of the piston ring 10, for example, as well. The black hard carbon layers B and the white hard carbon layers W are not particularly limited to this laminated order. In the examples of FIGS. 2A and 2B, a repeating unit obtained by forming the black hard carbon layer B and then forming the white hard carbon layer W thereon is laminated, but a repeating unit obtained by forming the white hard carbon layer W and then forming the black hard carbon layer B thereon may be laminated. The repeating unit may be either form illustrated in FIGS. 2A and 2B, and the black hard carbon layer B and the white hard carbon layer W constituting the repeating unit are formed in an adjacent manner. It should be noted that the hard carbon layer of the uppermost portion is desirably constituted by the black hard carbon layer B having low hardness from the viewpoint of running-in property.

The black hard carbon layer B, similar to the prior art, relatively has high density and a small $sp^2/sp^3$ ratio and is excellent in strength, and the white hard carbon layer relatively has low density and a large $sp^2/sp^3$ ratio and is excellent in low frictionality and chipping resistance. However, the coating film 1 of the present invention has a different hardness from that of the prior art and, in the black hard carbon layer B and the white hard carbon layer W adjacent to each other, the white hard carbon layer W has higher hardness than the black hard carbon layer B. That is, the black hard carbon layer B has low hardness, a small $sp^2/sp^3$ ratio, and high density in comparison to those of the white hard carbon layer W adjacent thereto. In other words, the white hard carbon layer W has high hardness, a large $sp^2/sp^3$ ratio, and low density in comparison to those of the black hard carbon layer B adjacent thereto. With the coating film 1 composed of a laminate of such a repeating unit of the black hard carbon layer B and the white hard carbon layer W, as illustrated by the results of the examples, it is possible to obtain the sliding member 10 excellent in chipping resistance, wear resistance, and peeling resistance (adhesion) on the basis of the laminating effect of the hard carbon layers B, W having different properties.

As illustrated in Example 2 described later, the $sp^2/sp^3$ ratio of the black hard carbon layer B may increase from the base material 11 side toward the surface position in the thickness direction of the coating film 1. It should be noted that the $sp^2/sp^3$ ratio is a simplified representation of the $[sp^2/(sp^2+sp^3)]$ ratio, and is measured by a method described in the explanation section of the "$sp^2/sp^3$ ratio" described later.

With regard to hardness, the Vickers hardness of the black hard carbon layer B is preferably within a range of 700 to 1600 HV, and more preferably within a range of 750 to 1200 HV. The Vickers hardness of the white hard carbon layer W is preferably higher than the Vickers hardness of the adjacent black hard carbon layer B and within a range of 1200 to 2200 HV, and more preferably within a range of 1250 to 1900 HV.

With regard to the $sp^2/sp^3$ ratio, the $sp^2/sp^3$ ratio of the black hard carbon layer B is preferably within a range of 0.05 to 0.75. The $sp^2/sp^3$ ratio of the white hard carbon layer W is preferably larger than the $sp^2/sp^3$ ratio of the black hard carbon layer B and within a range of 0.20 to 0.80. While the black hard carbon layer B having a small $sp^2/sp^3$ ratio has a relatively large number of carbon bonds ($sp^3$ bonds), represented by diamond, and thus has high density and therefore high hardness, in the present invention, the density is high, but the hardness is low. On the other hand, while the white hard carbon layer W having a large $sp^2/sp^3$ ratio has a relatively large number of carbon bonds ($sp^2$ bonds), represented by graphite, and thus has low density and therefore low hardness, in the present invention, the density is high, but the hardness is high. This is considered to be caused by the film-forming process described later. It should be noted that $sp^2$ and $sp^a$ can be measured by a TEM-EELS obtained by combining electron energy-loss spectroscopy (EELS) with a TEM. It should be noted that "high," "low," "large," and "small" here mean relatively high or low and large or small between the black hard carbon layer B and the white hard carbon layer W.

With regard to a thickness ratio (T1/T2), the ratio (T1/T2) of a thickness T1 of the black hard carbon layer B to a thickness T2 of the white hard carbon layer W is preferably within a range of 1/10 to 1.5/1. The thickness ratio (T1/T2) of the repeating unit is within the above-described range, and thus this thickness ratio can be controlled as desired and be constant or varied in the thickness direction Y of the coating film 1. The variation in the thickness ratio may be gradually increased or decreased, or set as the thickness ratio at the start of film formation or at the end of film formation may be different from that of other portions.

For example, in a case in which the ratio (T1/T2) of the thickness of the black hard carbon layer B and the white hard carbon layer W is the same or substantially the same in the thickness direction Y of the coating film 1, the low frictionality and the chipping resistance of each repeating unit are about the same, and thus the chipping resistance and the wear resistance can be exhibited in a stable constant state even when the wear of the coating film 1 gradually progresses. Further, for example, in a case in which the ratio (T1/T2) of the thickness of the black hard carbon layer B and the white hard carbon layer W is gradually varied in the thickness direction Y of the coating film 1, the low frictionality and chipping resistance of the repeating unit in the initial stage of sliding and the low frictionality and chipping resistance of the repeating unit after the initial stage can be intentionally produced, and thus the chipping resistance and the wear resistance in a case in which the wear of the coating film 1 gradually progresses can be controlled.

With regard to a thickness T, the thickness T of the repeating unit is preferably within a range of 0.2 to 2 μm. The thickness T of each repeating unit can be controlled as desired and be set within the above-described range.

An interface of the black hard carbon layer B on the side of the white hard carbon layer W may have a three-dimensional growth form that can be described as slightly mesh-like, scaly, dendritic, or layered. With such a growth form, the black hard carbon layers B may contain the white hard carbon. Further, the triangular-wave form of the black hard carbon layers B can also be seen as a V-shape (a form that widens from the position of the pivot of the fan toward the end) or a radial shape with respect to the growth direction of the film. From FIG. 3, FIG. 4, and FIG. 7, it is understood that, in each black hard carbon layer B, the thicker the layer, the more easily a mesh is formed, causing the black layer to slightly whiten as a whole.

Figure 3:
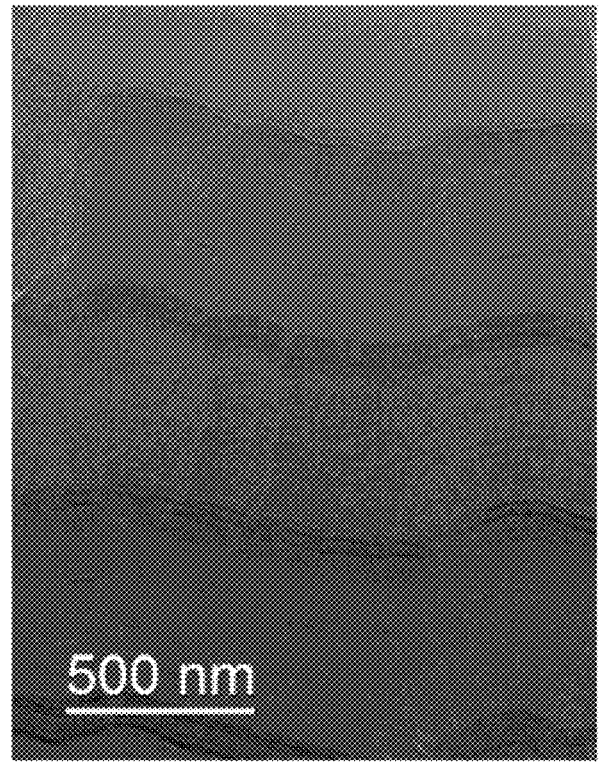
FIG. 3 is a bright-field TEM image of a cross section showing an example of the coating film.
Figure 4:
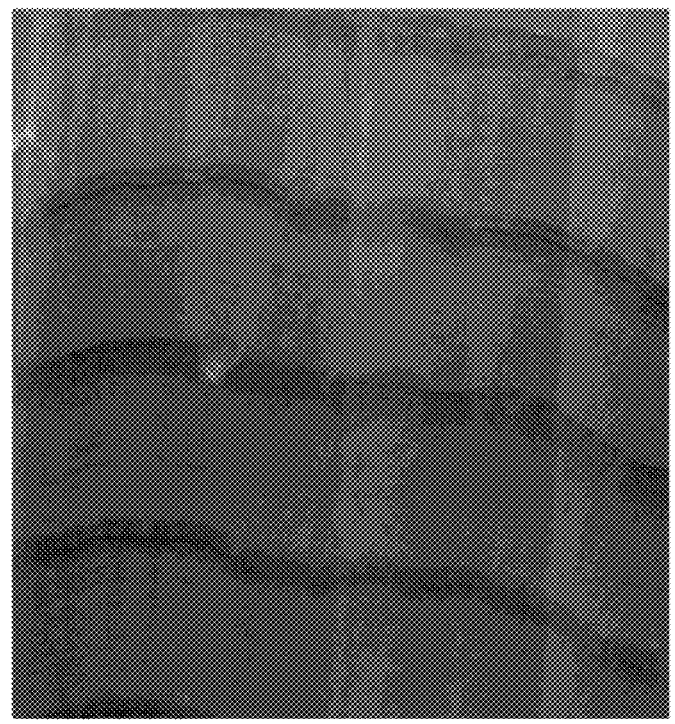
FIG. 4 is a bright-field TEM image of a cross section showing another example of the coating film.
Figure 7:
FIG. 7 is a bright-field TEM image of a cross section showing another example of the coating film.

As shown in FIG. 3, FIG. 4 and, FIG. 7, the white hard carbon layer W can be visually recognized as having a fine striped pattern, and similarly the black hard carbon layer B can also be visually recognized as having a fine striped pattern. Although the clear reason that the individual layers (white hard carbon layer W, black hard carbon layer B) in which such a striped pattern is repeated are visually recognized is not known at this time, it is conceivable that such visual recognition is based on the fact that the distance to the target changes continuously when the coating film 1 is formed by being rotated, as in a case in which the coating film 1 is formed on the sliding surface of a piston ring having a ring shape.

The coating film 1 is preferably formed at a total thickness within the range of 1 μm to 50 μm. The thick coating film 1 within the above-described range obtained by laminating the black hard carbon layers B and the white hard carbon layers W can be formed by alternately carrying out film formation at 200° C. or less and film formation above 200° C., for example, as the film-forming temperature (base material temperature) in a PVD method. Film formation at 200° C. or less generates the white hard carbon layers W having a slightly large $sp^2/sp^3$ ratio. On the other hand, film formation above 200° C. generates the black hard carbon layers B having a small $sp^2/sp^3$ ratio. The coating film 1 can be formed into a film having a thickness within the above-described range by alternately laminating these films.

It should be noted that, in a portion of the coating film 1, a raised shape (not illustrated) that extends across at least two or more laminated layers may appear. This raised shape is a portion seen as a form with a stratum raised, and as a particle or balloon shape as well. When the raised shape exists, the coating film 1 is not aligned in the thickness direction Y or uniformly laminated, and thus the raised shape readily appears mainly in the upper half and the laminated state is seen as disarranged. However, the properties such as wear resistance and chipping resistance are not significantly affected. The formation mechanism of the raised shape is not clear at this time, but it is conceivable that macro particles during film formation serve as the starting point.

The black hard carbon layer B and the white hard carbon layer W constituting the coating film 1 contain almost no hydrogen on the basis of the film formation conditions. If an attempt is made to estimate the hydrogen content, it can be said that it is greater than or equal to 0.01 atom % and less than 5 atom %. The hydrogen content can be measured by hydrogen forward scattering (HFS) analysis, and preferably the remnant is substantially carbon only and does not contain impurities other than N, B, Si, and other inevitable impurities.

(Formation of Coating Film)

The coating film 1 can be formed by applying a PVD method such as an arc-type PVD method or a sputtering PVD method. Further, among these, formation by an arc ion plating method that uses a carbon target and does not contain hydrogen atoms in the film-forming raw material is preferred. When the coating film 1 is formed by an arc ion plating method, for example, the ON/OFF of the bias voltage, control of the bias voltage value, adjustment of the arc current, heating control of the base material by the heater, forced cooling of the base material in which a cooling mechanism is introduced in a jig (holder) for setting the base material, and the like can be set as the film formation conditions. In particular, in the present invention, in order to form the above-described coating film 1, the black hard carbon layer B is formed by applying a bias voltage, and the white hard carbon layer W is formed by applying a bias voltage at 0 V or in a small range (for example, greater than 0 V and less than or equal to −50 V).

The black hard carbon layer B having an $sp^2/sp^3$ ratio of 0.05 to 0.75 is formed at a bias voltage that causes a temperature rise. The bias voltage can be set, for example, within a range of −100 to −300 V, the arc current at that time is within a range of 40 to 120 A, and film formation is performed with the base material temperature within a range of 100° C. to 300° C. On the other hand, the white hard carbon layer W having an $sp^2/sp^3$ ratio of 0.20 to 0.80 is formed at a bias voltage that does not cause a temperature rise. The bias voltage can be set to 0 V or, for example, within a range greater than 0 V and less than or equal to −50 V, the arc current at that time is within a range of 40 to 120 A, and film formation is performed while gradually reducing and not causing a rise in the base material temperature. It should be noted that the base material temperature can be adjusted by items other than the bias voltage as well, such as the arc current, the heater temperature, and the furnace pressure. Further, when the furnace pressure is $10^{-4}$ to $5 \times 10^{-1}$ Pa in a vacuum atmosphere, a hard carbon layer having low friction and high wear resistance compared to a case in which hydrogen gas or nitrogen gas is introduced can be obtained, and therefore it is preferable.

($sp^2/sp^3$ Ratio)

A hard carbon layer is a film in which carbon-bonding $sp^2$ bonds represented by graphite and carbon-bonding $sp^3$ bonds represented by diamond coexist. Here, by EELS analysis, 1 s->$\pi^*$ intensity and 1 s->$\sigma^*$ intensity are measured and, with 1 s->$\pi^*$ intensity regarded as $sp^2$ intensity and 1 s->$\sigma^*$ intensity regarded as $sp^3$ intensity, the ratio of 1 s->$\pi^*$ intensity to 1 s->$\sigma^*$ intensity is calculated as the $[sp^2/(sp^2+sp^3)]$ ratio (also abbreviated as "$sp^2/sp^3$ ratio"). Accordingly, the $sp^2/sp^3$ ratio in the present invention, to be exact, refers to the π/σ intensity ratio. Specifically, a spectral imaging method in a STEM (scanning TEM) mode is applied and, under the conditions of an acceleration voltage of 200 kv, a sample absorption current of $10^{-9}$A, and a beam spot size diameter of 1 nm, EELS obtained at a pitch of 1 nm are integrated, a C-K absorption spectrum is extracted as average information from a region of approximately 10 nm, and the $sp^2/sp^3$ ratio is calculated.

It should be noted that, before formation of the black hard carbon layer B or formation of the white hard carbon film layer W, a bombarding treatment using a carbon target may be performed. This bombarding treatment may be performed before formation of all black and white hard carbon film layers B, W, respectively, only before formation of the black hard carbon layers B, only before formation of the white hard carbon layers W, or before formation of any hard carbon layer not limited to these. It should be noted that, in the example shown in FIG. 7, it can be visually recognized that the carbon layer formed by the bombarding treatment is included only directly below the black hard carbon layers B.

EXAMPLES

The following describes the coating film and the sliding member according to the present invention in further detail using examples and reference examples.

Example 1

A piston ring was applied as the sliding member 10. On the piston ring base material 11 (88-mm diameter, 2.9-mm ring-width in the radial direction, 1.2-mm ring-width in the axial direction) composed of C: 0.65 mass %, Si: 0.38 mass %, Mn: 0.35 mass %, Cr: 13.5 mass %, Mo: 0.3 mass %, P: 0.02 mass %, S: 0.02 mass %, remnant: iron and inevitable impurities, a nitrided layer of 40 μm was formed by nitriding treatment, and a chromium metal layer having a thickness of 0.2 μm was formed as the intermediate layer 12 by an ion plating method. Then, on the intermediate layer 12, repeating units of the black hard carbon layer B and the white hard carbon layer W were formed into a film by using an arc ion plating device with a carbon target to obtain the coating film 1.

The black hard carbon layer B was arc-discharged for 8 minutes at a bias voltage of −150 V and an arc current of 40 A to form the black hard carbon layer B having the thickness T1 of 0.14 μm. The white hard carbon layer W to be formed thereon was arc-discharged (arc current: 40 A) for 22 minutes at a bias voltage of 0 V to form the white hard carbon layer W having the thickness T2 of 0.41 μm. The thickness T of the repeating unit was 0.55 μm, and film formation of this repeating unit was performed 20 times to obtain the coating film 1 having a total thickness of 11 μm.

[Evaluation]

Bright-field TEM images of the cross section of the coating film 1 thus formed were taken. As shown in FIG. 3 and FIG. 4, in the coating film 1, it could be confirmed that the black hard carbon layers B, relatively shown in black, and the white hard carbon layers W, relatively shown in white, are alternately laminated in the thickness direction. Further, the $sp^2/sp^3$ ratio was within a range of 0.25 to 0.75 in each portion of the black hard carbon layers B, and within a range of 0.4 to 0.80 in each portion of the white hard carbon layers W.

[Observation of Structural Form]

Cross-sectional images of the coating film 1 described above were obtained by taking images of the cross section of the coating film 1 using a bright-field TEM at an acceleration voltage of 200 kV. Further, the total thickness of the coating film 1 and the thicknesses of the black hard carbon layers B and the white hard carbon layers W were found from the bright-field TEM images. For thickness measurement, a piston ring with the coating film 1 formed near a center of an effective coating range of a used arc ion plating device, and a piston ring with the coating film 1 formed near an upper end and a lower end were adopted as measurement samples. The ratio (T1/T2) of the thickness T1 of the black hard carbon layers B to the thickness T2 of the white hard carbon layers W thus obtained was calculated.

[Wear Resistance, Chipping Resistance, Low Frictionality, and Peeling Resistance]

Figure 6:
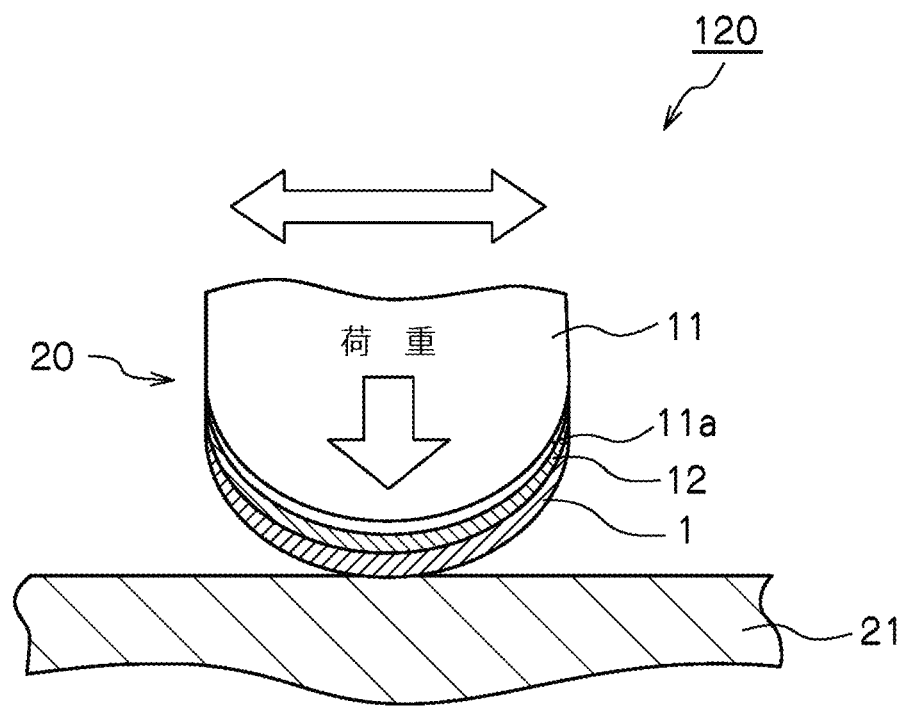
FIG. 6 is a schematic view of a friction-abrasion testing method by an SRV tester.

Various properties of the formed coating film 1 were obtained by a friction-wear testing method using a Schwingungs Reihungund and Verschleiss (SRV) tester 120 generally used in the evaluation of sliding members for automobiles. Specifically, with a sliding surface of a friction-wear test sample 20 in contact with SUJ2 material serving as a sliding object 21 as illustrated in FIG. 6, the friction-wear test sample 20 was reciprocally slid for 10 minutes and for 60 minutes at each load while applying a load of 1000 N, by using 5W-30 (Mo-DTC free) as the lubricant, and the sliding surface of the friction-wear test sample 20 was observed under a microscope. In FIG. 6, reference numeral 12 denotes the intermediate layer, and reference numeral 1 denotes the coating film.

It was confirmed that the obtained coating film 1 was free of peeling as well as chipping, and included a coating film exhibiting constant and stable chipping resistance and wear resistance and excellent in peeling resistance (adhesion).

In the coating film 1 obtained in this test, the chipping resistance and the wear resistance were favorable and the aggressiveness against the mated material was also favorable, making the sliding properties stable with respect to both the coating film 1 and the mated material. Such characteristics are particularly desirable for sliding members such as piston rings to which high loads are applied and coating films and, compared to sliding members that do not have these characteristics, a sliding member exhibiting constant and stable chipping resistance and wear resistance and excellent in peeling resistance (adhesion) can be obtained.

Example 2

A piston ring was applied as the sliding member 10 in this Example 2 as well, and the nitrided layer and the intermediate layer 12 were also formed as in Example 1 by using the same piston ring base material 11 as that in Example 1. As in Example 1, on the intermediate layer 12, repeating units of the black hard carbon layer B and the white hard carbon layer W were also formed into a film by using an arc ion plating device with a carbon target to obtain the coating film 1. It should be noted that, in this example, in a case in which the black hard carbon layer B and the white hard carbon layer W were repeatedly formed, before formation of the black hard carbon layer B, a carbon layer (refer to the thin white layer in FIG. 7) was formed by a bombarding treatment (bias voltage: any voltage from −500 V to −2000 V, specifically −1000 V).

As the film formation conditions in this Example 2, the black hard carbon layer B was arc-discharged for 10 minutes at a bias voltage of −150 V and an arc current of 40 A to form the black hard carbon layer B having the thickness T1 of 0.18 μm. The white hard carbon layer W to be formed thereon was arc-discharged (arc current: 40 A) for 20 minutes at a bias voltage of −30 V to form the white hard carbon layer W having the thickness T2 of 0.35 μm. The thickness T of the repeating unit was 0.53 μm, and film formation of this repeating unit was performed 20 times to obtain the coating film 1 having a total thickness of 10.6 μm.

[Evaluation of Example 2]

Bright-field TEM images of the cross section of the coating film 1 of Example 2 were taken and are shown in FIG. 7. As shown in FIG. 7, in the coating film 1, it could be confirmed that the black hard carbon layers B, relatively shown in black, and the white hard carbon layers W, relatively shown in white, are alternately laminated in the thickness direction. Further, as shown in FIG. 7, a fine striped pattern was observed in the white hard carbon layer W and in the black hard carbon layer B as well. The $sp^2/sp^3$ ratio of this coating film 1 was within a range of 0.05 to 0.55 in each portion of the black hard carbon layers B, and within a range of 0.20 to 0.70 in each portion of the white hard carbon layers W. Furthermore, a Vickers hardness of the black hard carbon layer was within a range of 700 to 1100 HV, and a Vickers hardness of the white hard carbon layer W was higher than a Vickers hardness of the adjacent black hard carbon layer B and within a range of 1200 to 1900 HV.

With the thickness T (=T1+T2) of the repeating unit of Example 2 being a thin 0.53 μm, the thickness T1 of the black hard carbon layer B being a thin 0.18 μm, and the thickness T2 of the white hard carbon layer W being a thin 0.35 μm, measurement of Vickers hardness of each single layer of the black hard carbon layer B and the white hard carbon layer W in the cross section is almost impossible, even with the current highest level measurement technology. Further, even if an attempt is made to measure the hardness from the surface, the measurement is affected by the hardness of the lower layer due to the thin thickness, making it difficult even with the current highest level measurement technology. Therefore, the Vickers hardness here was evaluated based on the results of thickly forming and measuring the black hard carbon layer B only and the white hard carbon layer W only.

Specifically, because hardness depends on the film-forming temperature, in Example 2, given $T_B$ as the base material temperature at the end of film formation of the black hard carbon layer B accompanied by a temperature rise and $T_W$ as the base material temperature at the end of film formation of the white hard carbon layer W accompanied by a temperature reduction, $T_B > T_W$. To form a single layer of the black hard carbon layer B, the black hard carbon layer B was formed to 0.18 μm and subsequently cooled until the base material temperature dropped to $T_W$. Then, as soon as the base material temperature reached $T_W$, film formation of the black hard carbon layer B was started, and the layer was formed to 0.18 μm. Subsequently, the cooling until the base material temperature dropped to $T_W$ and the film formation of the black hard carbon layer B were repeated, obtaining a single-layer film with only the black hard carbon layers B of Example 2 being formed. On the other hand, to form a single layer of the white hard carbon layer W, the white hard carbon layer W was formed to 0.35 μm and subsequently heated by a heater until the base material temperature rose to $T_B$. Then, as soon as the base material temperature reached $T_B$, film formation of the white hard carbon layer W was started, and the layer was formed to 0.35 μm. Subsequently, the heating until the base material temperature dropped to $T_B$ and the film formation of the white hard carbon layer W were repeated, obtaining a single-layer film with only the white hard carbon layer W of Example 2 being formed. In this way, in the measurement of hardness from the surface, the single-layer films of the black hard carbon layer B and the white hard carbon layer W, formed to film thickness (6 μm or greater) not affected by the base material, were each adjusted to a surface roughness of about Ra 0.05 and measured for Vickers hardness from the surface layer with a Vickers hardness meter under a load of 100 gf. In this example, evaluation was carried out by the Vickers hardness measured by this method.

Example 3

A piston ring was applied as the sliding member 10 in this Example 3 as well, and the nitrided layer and the intermediate layer 12 were also formed as in Example 1 by using the same piston ring base material 11 as that in Example 1. As in Example 1, on the intermediate layer 12, repeating units of the black hard carbon layer B and the white hard carbon layer W were also formed into a film by using an arc ion plating device with a carbon target to obtain the coating film 1. It should be noted that, in this example as well, as in Example 2, a carbon layer was formed by a bombarding treatment before formation of the black hard carbon layer B.

As the film formation conditions in this Example 3, the black hard carbon layer B was arc-discharged for 8 minutes at a bias voltage of −130 V and an arc current of 40 A to form the black hard carbon layer B having the thickness T1 of 0.13 μm. The white hard carbon layer W to be formed thereon was arc-discharged (arc current: 40 A) for 22 minutes at a bias voltage of −50 V to form the white hard carbon layer W having the thickness T2 of 0.39 μm. The thickness T of the repeating unit was 0.52 μm, and film formation of this repeating unit was performed 20 times to obtain the coating film 1 having a total thickness of 10.4 μm.

[Evaluation of Example 3]

Bright-field TEM images of the cross section of the coating film 1 of Example 3 also showed a form similar to that of FIG. 7. The $sp^2/sp^3$ ratio of this coating film 1 was within a range of 0.05 to 0.35 in each portion of the black hard carbon layers B, and within a range of 0.20 to 0.50 in each portion of the white hard carbon layers W. A Vickers hardness of the black hard carbon layer B was within a range of 1050 to 1600 HV, and a Vickers hardness of the white hard carbon layer W was higher than a Vickers hardness of the adjacent black hard carbon layer B and within a range of 1650 to 2200 HV. The Vickers hardness of Example 3 was also measured by the same method as that in Example 2.

Summarizing the results of Examples 1 to 3, it can be said that the $sp^2/sp^3$ ratio was within the range of 0.05 to 0.75 in each portion of the black hard carbon layers B, and within the range of 0.20 to 0.80 in each portion of the white hard carbon layers W. It can be said that a Vickers hardness of the black hard carbon layer B was within the range of 700 to 1600 HV, and a Vickers hardness of the white hard carbon layer W was higher than a Vickers hardness of the adjacent black hard carbon layer B and within the range of 1200 to 2200 HV.

While the above has described the present invention on the basis of embodiments, the present invention is not limited to the embodiments described above. Various changes can be made to the embodiments described above within the same scope as and equivalent scope to the present invention.

DESCRIPTIONS OF REFERENCE NUMERALS

1 Coating film
11 Base material (Piston ring base material)
11a Underlayer
12 Intermediate layer
16 Sliding surface
20 Friction-abrasion test sample
21 Sliding object
120 SRV tester
B Black hard carbon layer
W White hard carbon layer
Y Thickness direction

What is claimed is:
1. A sliding member comprising:
    a coating film on a sliding surface on a base material,
    the coating film having, when a cross section thereof is observed by a bright-field TEM image, a total thickness within a range of 1 μm to 50 μm, in repeating units including black hard carbon layers, relatively shown in black, and white hard carbon layers, relatively shown in white, and laminated in a thickness direction, and in the black hard carbon layer and the white hard carbon layer adjacent to each other, the white hard carbon layer having higher hardness and a larger $[sp^2/(sp^2+sp^3)]$ ratio than the black hard carbon layer.

2. The sliding member according to claim 1, wherein a ratio (T1/T2) of a thickness T1 of the black hard carbon layer to a thickness T2 of the white hard carbon layer is within a range of 1/10 to 1.5/1.

3. The sliding member according to claim 1, wherein a thickness of the repeating unit is within a range of 0.2 to 2 μm.

4. The sliding member according to claim 1, wherein a Vickers hardness of the black hard carbon layer is within a range of 700 to 1600 HV, and a Vickers hardness of the white hard carbon layer is higher than a Vickers hardness of the adjacent black hard carbon layer and within a range of 1200 to 2200 HV.

5. The sliding member according to claim 1, wherein the $[sp^2/(sp^2+sp^3)]$ ratio of the black hard carbon layer is within a range of 0.05 to 0.75, and the $[sp^2\ sp^2+sp^3)]$ ratio of the white hard carbon layer is larger than the $[sp^2/(sp^2+sp^3)]$ ratio of the black hard carbon layer and within a range of 0.20 to 0.80.

6. The sliding member according to claim 1, wherein, when a cross section thereof is observed by a bright-field TEM image, a hard carbon base film is provided between the base material or a base film provided on the base material, and the coating film.

7. The sliding member according to claim 1, wherein, when a cross section thereof is observed by a bright-field TEM image, a hard carbon surface film is provided on the coating film.

8. The sliding member according to claim 1, wherein the $[sp^2/(sp^2+sp^3)]$ ratio of the black hard carbon layer increases from the base material side toward a surface position in a thickness direction of the coating film.

9. The sliding member according to claim 1, wherein the white hard carbon layer has a fine striped pattern.

10. The sliding member according to claim 1, wherein the black hard carbon layer has a fine striped pattern.

11. The sliding member according to any one of claims 1 to 10, wherein
the black hard carbon layer and the white hard carbon layer each include, directly below, a carbon layer formed by a bombarding treatment.

12. The sliding member according to claim 1, wherein the sliding member is a piston ring.

13. A manufacturing method of a sliding member including a coating film on a sliding surface on a base material,
the coating film having, when a cross section thereof is observed by a bright-field TEM image, a total thickness within a range of 1 μm to 50 μm, in repeating units including black hard carbon layers, relatively shown in black, and white hard carbon layers, relatively shown in white, and laminated in a thickness direction, the white hard carbon layer having higher hardness than the black hard carbon layer, and
the manufacturing method comprising:
forming the black hard carbon layer at a bias voltage that causes a temperature rise; and
forming the white hard carbon layer at a bias voltage that does not cause a temperature rise.

14. A coating film having, when a cross section thereof is observed by a bright-field TEM image, a total thickness within a range of 1 μm to 50 μm, in repeating units including black hard carbon layers, relatively shown in black, and white hard carbon layers, relatively shown in white, and laminated in a thickness direction and, in the black hard carbon layer and the white hard carbon layer adjacent to each other, the white hard carbon layer having higher hardness and a larger $[sp^2/(sp^2+sp^3)]$ ratio than the black hard carbon layer.

* * * * *